US009657407B2

(12) United States Patent
Andreaco et al.

(10) Patent No.: US 9,657,407 B2
(45) Date of Patent: May 23, 2017

(54) CANTILEVER DEVICE FOR EXTENDING CAPACITY OF A SCALE USED IN A CRYSTAL GROWTH APPARATUS

(71) Applicant: Siemens Medical Solutions USA, Inc., Malvern, PA (US)

(72) Inventors: Mark S. Andreaco, Knoxville, TN (US); James L. Corbeil, Knoxville, TN (US); Brant Quinton, Knoxville, TN (US); Troy Marlar, Knoxville, TN (US); Ronald Nutt, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 461 days.

(21) Appl. No.: 14/522,640

(22) Filed: Oct. 24, 2014

(65) Prior Publication Data
US 2015/0114283 A1    Apr. 30, 2015

Related U.S. Application Data

(60) Provisional application No. 61/896,827, filed on Oct. 29, 2013.

(51) Int. Cl.
| | |
|---|---|
| *C30B 15/30* | (2006.01) |
| *C30B 15/00* | (2006.01) |
| *C30B 15/32* | (2006.01) |
| *C30B 35/00* | (2006.01) |
| *C30B 15/28* | (2006.01) |
| *C30B 13/28* | (2006.01) |
| *C30B 29/34* | (2006.01) |

(52) U.S. Cl.
CPC .............. *C30B 15/00* (2013.01); *C30B 15/28* (2013.01); *C30B 15/30* (2013.01); *C30B 15/32* (2013.01); *C30B 35/00* (2013.01); *C30B 13/285* (2013.01); *C30B 29/34* (2013.01); *Y10T 117/1004* (2015.01)

(58) Field of Classification Search
CPC ......... C30B 15/30; C30B 15/28; C30B 15/32; C30B 35/00; C30B 13/285
See application file for complete search history.

(56) References Cited

U.S. PATENT DOCUMENTS

| | | | | |
|---|---|---|---|---|
| 5,763,838 | A * | 6/1998 | Morimura | ............... C30B 15/28 177/245 |
| 6,010,569 | A * | 1/2000 | Schulmann | ............. C30B 15/00 117/216 |
| 6,113,686 | A * | 9/2000 | Iino | ......................... C30B 15/22 117/13 |

\* cited by examiner

*Primary Examiner* — Matthew Song

(57) ABSTRACT

A cantilever device for extending capacity of a scale used in a crystal growth apparatus having a pulling head wherein upward movement of a support column in the pulling head decreases a weight measured by the scale. The device includes a horizontal arm having first and second brackets, wherein the first bracket is attached to the pulling head. The device also includes a plate that extends through openings in the first and second brackets, wherein the plate includes a contact end and a free end. Further, the device includes a flexible element attached between the arm and the plate to form a pivot to enable rotation of the plate. A load is positioned on the plate wherein the load causes rotation of the plate about the pivot to cause upward movement of the contact end to move the support column upward to decrease weight measured by the scale.

20 Claims, 3 Drawing Sheets

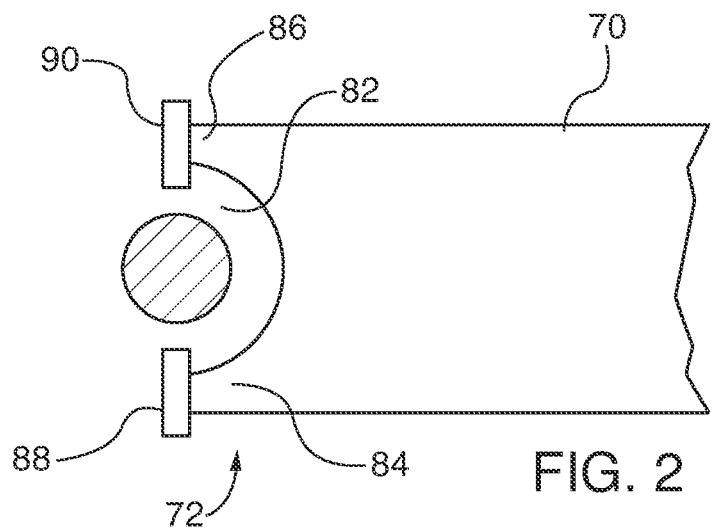
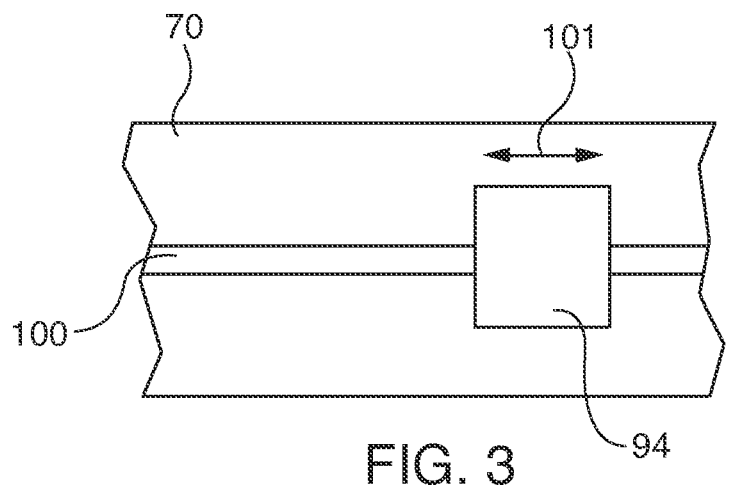
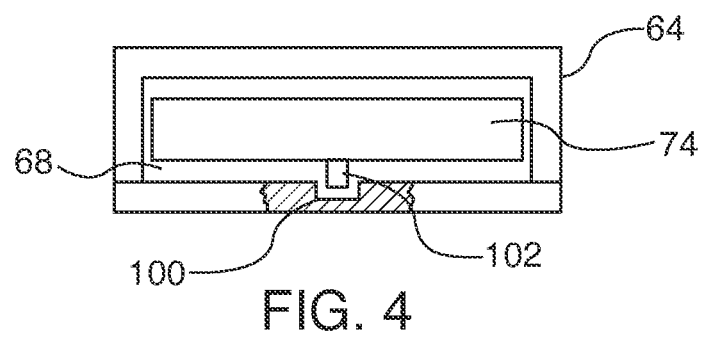

US 9,657,407 B2

CANTILEVER DEVICE FOR EXTENDING CAPACITY OF A SCALE USED IN A CRYSTAL GROWTH APPARATUS

CROSS REFERENCE TO RELATED APPLICATION

This application claims the benefit under 35 U.S.C. §119 (e) of U.S. Provisional Application No. 61/896,827 entitled GROWTH STATION LOAD CELL INCREASED CAPACITY, Attorney Docket No. 2013P21397US, filed on Oct. 29, 2013 which is incorporated herein by reference in its entirety and to which this application claims the benefit of priority.

FIELD OF THE INVENTION

The invention relates to crystal growth apparatus, and more particularly, to a cantilever device for extending capacity of a scale used in the crystal growth apparatus wherein the device includes a rotatable plate and wherein a load is placed on the plate to cause rotation of the plate such that a contact end of the plate moves a support column upward to decrease weight measured by the scale.

BACKGROUND OF THE INVENTION

A Czochralski crystal growth technique is frequently used to grow single crystals. In this technique, a melt is formed by heating a material in a crucible. A single crystal is then grown by withdrawing a rotating seed crystal that is in contact with the melt. As the seed crystal is withdrawn or pulled from the crucible, the melt solidifies on the seed. A pulling head arrangement, which is part of a crystal growth apparatus, is typically used to pull the single crystal.

An oxyorthosilicate material may be used to form a single crystal. For example, single crystals fabricated from an oxyorthosilicate material may be used in detectors for positron emission tomography (PET) medical scanners utilized in molecular imaging. An oxyorthosilicate crystal is typically grown in the form of a long cylindrical boule.

It is important to be able to measure the weight of the boule during initial stages of boule formation. A boule is relatively light during initial stages of boule formation. Therefore, a scale having sufficient low-end resolution is used to measure the weight of a lightweight boule. However, scales having sufficient low-end resolution do not have sufficient weight to weigh a full size boule having a desired target weight.

SUMMARY OF INVENTION

A cantilever device for extending capacity of a scale used in a crystal growth apparatus having a pulling head wherein upward movement of a support column in the pulling head decreases a weight measured by the scale. The device includes a horizontal arm having first and second brackets, wherein the first bracket is attached to the pulling head. The device also includes a plate that extends through openings in the first and second brackets, wherein the plate includes a contact end and a free end. Further, the device includes a flexible element attached between the arm and the plate wherein the plate is suspended to form a pivot to enable rotation of the plate. A load is positioned on the plate such that the pivot is located between the load and the contact end. The load causes rotation of the plate about the pivot to cause upward movement of the contact end to move the support column upward to decrease weight measured by the scale such that the scale again has weight measuring capacity. Thus, formation of a boule by the crystal growth apparatus may be continued until a target weight for the boule is achieved, thereby extending capacity of the scale. In addition, the invention enables use of a scale having sufficient low-end resolution to be able to measure the weight of a boule during initial stages of boule formation.

The respective features of the present invention may be applied jointly or severally in any combination or sub-combination by those skilled in the art.

BRIEF DESCRIPTION OF DRAWINGS

The teachings of the present invention can be readily understood by considering the following detailed description in conjunction with the accompanying drawings, in which:

FIG. 2 is a partial cross sectional view along view line 2-2 of FIG. 1 that depicts a portion of a first plate end of the plate.

FIG. 3 is a view along view line 3-3 of FIG. 1 that depicts the plate and a block.

FIG. 4 is a partial cross sectional view along view line 4-4 of FIG. 1 that depicts a second bracket and second plate end.

To facilitate understanding, identical reference numerals have been used, where possible, to designate identical elements that are common to the figures.

DETAILED DESCRIPTION

Figure 1:
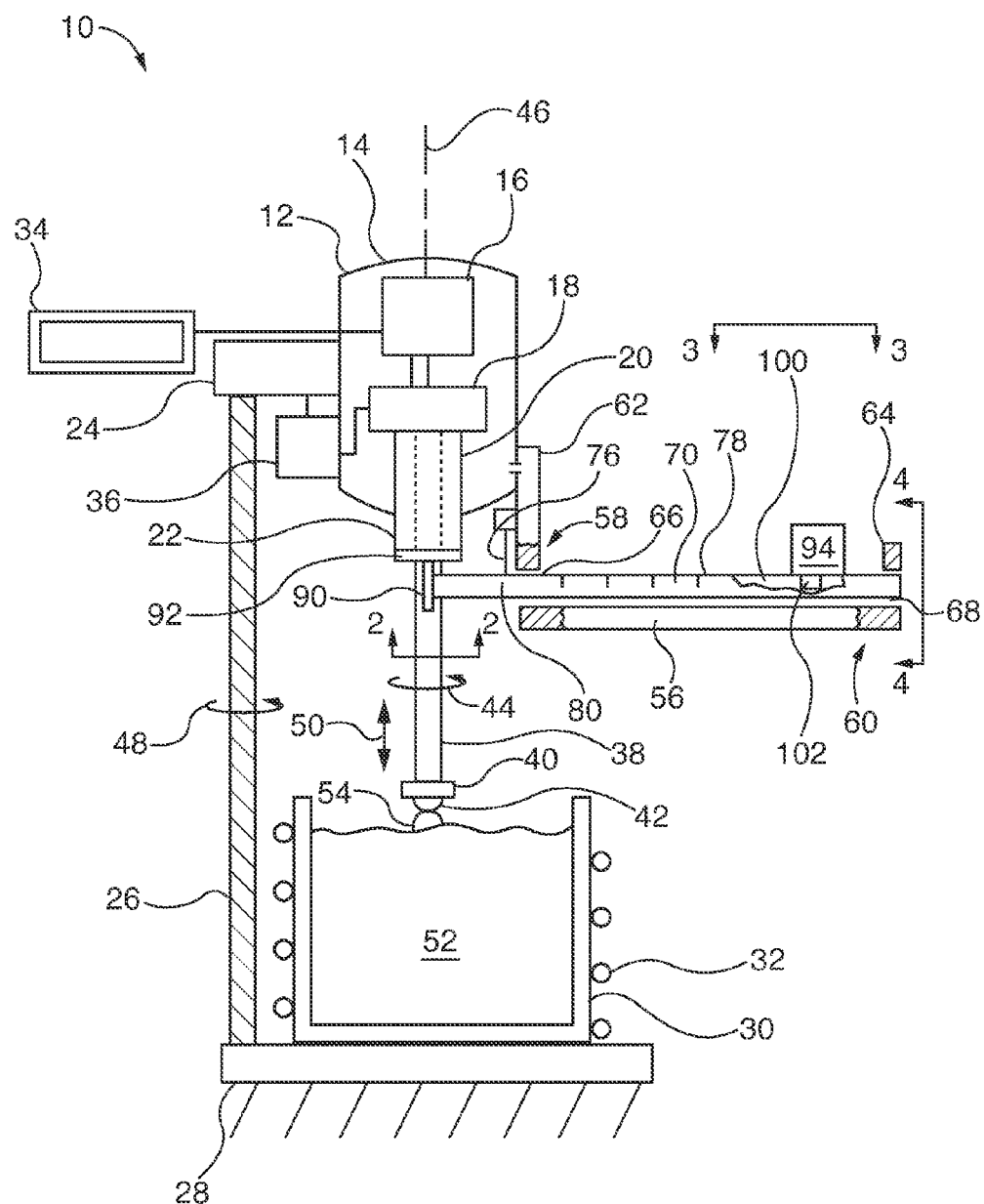
FIG. 1 is a partial cross sectional view of a crystal growth apparatus in accordance with an embodiment of the present invention.

Although various embodiments that incorporate the teachings of the present invention have been shown and described in detail herein, those skilled in the art can readily devise many other varied embodiments that still incorporate these teachings. The invention is not limited in its application to the exemplary embodiment details of construction and the arrangement of components set forth in the description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

Figure 1A:
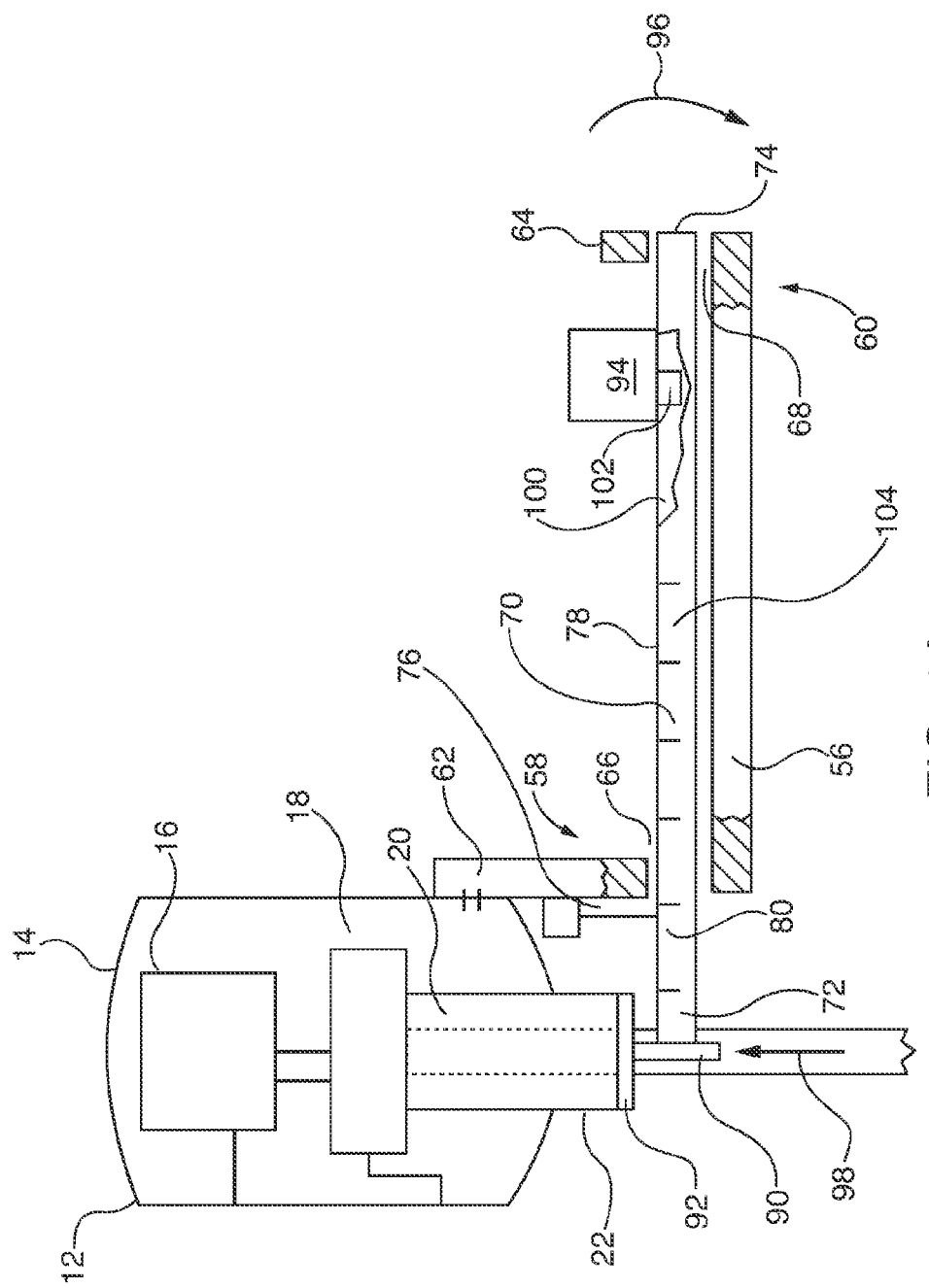
FIG. 1A is an enlarged partial cross sectional view of a pulling head, arm, plate and associated components shown in FIG. 1.

Referring to FIG. 1, a crystal growth apparatus 10 in accordance with an embodiment of the present invention is shown. FIG. 1A is an enlarged view of a pulling head 12, arm 56, plate 70 and associated components shown in FIG. 1. Referring to FIGS. 1 and 1A, the apparatus 10 may be used to implement a Czochralski crystal growth technique. The apparatus 10 includes the pulling head 12 that includes a housing 14 (shown without a housing cover) for holding a scale 16 and a servomotor 18 for rotating a shaft 20. The shaft 20 rotates within a support column 22 attached to the servomotor 18. In an embodiment, upward movement of the support column 22 and thus servomotor 18 decreases a weight measured by the scale 16. The apparatus 10 further includes a linear drive 24, a ball screw 26 for moving the pulling head 12 in a vertical direction, a stand 28 for supporting a crucible 30, a heating element 32, a display 34 for displaying a weight measured by the scale 16 and a controller 36 communicatively coupled to the servomotor 18 and the linear drive 24.

A pulling rod 38 is attached to the shaft 20. The pulling rod 38 includes a seed holder 40 for holding a seed crystal 42. During operation, the controller 36 activates the servomotor 18 to cause rotation 44 of the shaft 20 and thus the pulling rod 38, seed holder 40 and seed crystal 42 about a first axis 46. The controller 36 also activates the linear drive 24 to rotate 48 the ball screw 26 to move the pulling head 12 in a vertical direction 50. Therefore, the pulling rod 38 moves in a vertical direction 50 along the first axis 46 as it rotates 44 about the first axis 46.

The crucible 30 holds raw material suitable for forming a single crystal. The raw material may be, for example, an oxyorthosilicate material or a combination of materials. The heating element 32, which may include by way of example a known RF heating element, is positioned around sides of the crucible 30. The heating element 32 is used to heat the raw material to a suitable temperature for forming a melt 52. The seed crystal 42 is used to initiate the formation of a single crystal from the melt 52. The pulling rod 38 is rotated about the first axis 46 and lowered along the first axis 46 until the seed crystal 42 contacts the melt 52. This causes partial melting of the seed crystal 42 after which an equilibrium is established between the seed crystal 42 and the melt 52 so that there is neither melting nor crystallization of the seed crystal 42. The pulling rod 38 is then slowly raised and the seed crystal 42 is pulled out of the melt 52 as the pulling rod 38 rotates to gradually extract a single crystal in the form of a boule 54. The scale 16 measures the weight of the boule and associated apparatus 10 components. In an embodiment, the scale measures the weight of the servomotor 18, shaft 20, support column 22, pulling rod 38, seed holder 40, seed crystal 42 and boule 54. The weight is then shown on display 34. In particular, the boule 54 is extracted until a weight for the boule 54 is achieved that does not exceed the capacity of the scale 16.

In other embodiments, both the pulling rod 38 and crucible 30 are rotated wherein the crucible 30 is rotated in an opposite direction than the direction in which pulling rod 38 is rotated. Alternatively, only the crucible 30 is rotated. Several parameters affect formation of the boule 54 including rotation speed, temperature and the rate at which the seed holder 40 is withdrawn from the melt 52.

The pulling head 12 also includes the arm 56. Arm 56 is oriented horizontally and includes first 58 and second 60 arm ends having first 62 and second 64 vertical brackets, respectively. The first bracket 62 is attached to the housing 14 to form a cantilever arm arrangement. The first 62 and second 64 brackets include first 66 and second 68 openings, respectively. The plate 70 is oriented horizontally and includes first 72 and second 74 plate ends that extend through the first 66 and second 68 openings, respectively. A flexible element 76, such as a wire, is attached between a top surface 78 of the plate 70 and the first bracket 62. The flexible element 76 is sized such that the plate 70 is suspended above the arm 56. This forms a pivot 80 at a location wherein the flexible element 76 is attached to the top surface 78 of the plate 70. Thus, the plate 70 is rotatable about pivot 80. Referring to FIG. 2, a view along view line 2-2 of FIG. 1 is shown which depicts a portion of the first plate end 72 of plate 70. The first plate end 72 includes a cutout 82 that provides clearance for the pulling rod 38. The first plate end 72 also includes first 84 and second 86 leverage arms having first 88 and second 90 rotatable wheels, respectively, for contacting a flange 92 located on a bottom end of the support column 22. Alternatively, one wheel or more than two wheels may be used. In another embodiment, flat contact surfaces may be used instead of wheels.

A moveable block 94 having a predetermined weight is positioned on the top surface 78 of the plate 70 at a selected distance from the pivot 80. The weight and position of the block 94 cause clockwise rotation 96 of the plate 70 about the pivot 80. This causes the first 84 and second 86 leverage arms to move up toward the flange 92 such that the first 88 and second 90 rotatable wheels contact the flange 92 and urge the flange 92, and thus the support column 22 and the servomotor 18, upward 98. This decreases the weight sensed or measured by the scale 16 by a desired amount such that the scale 16 again has weight measuring capacity. Thus, formation of the boule 54 may be continued until a target weight for the boule 54 is achieved, thereby extending capacity of the scale. In addition, the invention enables use of a scale 16 having sufficient low-end resolution to be able to measure the weight of a boule during initial stages of boule formation. The first 88 and second 90 rotatable wheels assist in positioning of the plate 70 relative to the flange 92. In FIGS. 1 and 1A, the arm 56, plate 70 and associated components are shown extending from a right side of the pulling head 12. It is understood that the arm 56, plate 70 and associated components may extend from another side of the pulling head 12, such as the left side of the pulling head 12. In this configuration, the weight of the block 94 causes counterclockwise rotation of the plate 70 while still causing the first 88 and second 90 rotatable wheels to urge the flange 92 upward.

FIG. 3 is a view of the plate and block along view line 3-3 of FIG. 1. The plate 70 also includes a channel 100 that extends through the top surface 78 and between the first 72 and second 74 plate ends. The block 94 includes a downwardly extending guide 102 (see FIG. 1) that extends into the channel 100 to guide movement 101 of the block 94 along the top surface 78. The block 94 may be positioned on the plate 70 relative to the pivot 80 as desired in order to decrease or increase the weight measured by the scale 16 by a desired amount. In particular, moving the block 94 further away from the pivot 80 decreases the weight measured by the scale 16 whereas moving the block 94 closer to the pivot 80 increases the weight measured by the scale 16. The plate 70 includes indicia 104 for indicating the distance to the pivot 80 in order to assist positioning of the block 94 to obtain a desired decrease or increase in the weight sensed by the scale 16. In an embodiment, the block 94 weighs approximately 974 grams and the distance between the pivot 80 and the second plate end 74 is approximately 11.5 inches.

FIG. 4 is a view along view line 4-4 of FIG. 1 that depicts the second bracket 64 and second plate end 74. The second plate end 74 is located in the second opening 68. The second bracket 64 serves to limit vertical and horizontal movement of the second plate end 74 when the plate 70 rotates about the pivot 80.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A cantilever device for extending capacity of a scale used in a crystal growth apparatus having a pulling head wherein the scale measures a weight of crystal growth apparatus components and wherein upward movement of a support column in the pulling head decreases a weight measured by the scale:
   a horizontal arm attached to the pulling head;
   a plate having a contact end for contacting the support column;
   a flexible element attached between the arm and the plate to form a pivot to enable rotation of the plate; and
   a load positioned on the plate such that the pivot is located between the load and the contact end wherein the load causes rotation of the plate about the pivot to cause upward movement of the contact end to move the support column upward to decrease weight measured by the scale.

2. The cantilever device according to claim 1, wherein the plate includes a channel for receiving a guide that extends from the load.

3. The cantilever device according to claim 1, wherein the plate includes indicia for measuring a distance to the pivot.

4. The cantilever device according to claim 1, wherein the flexible element is a wire.

5. The cantilever device according to claim 1, wherein the load weighs approximately 974 grams.

6. The cantilever device according to claim 1, wherein the plate includes a cutout for providing clearance for a shaft extending from the servomotor.

7. A cantilever device for extending capacity of a scale used in a crystal growth apparatus having a pulling head wherein the scale measures a weight of crystal growth apparatus components and wherein upward movement of a support column in the pulling head decreases a weight measured by the scale:
   a horizontal arm having first and second brackets, wherein the first bracket is attached to the pulling head;
   a plate that extends through openings in the first and second brackets, wherein the plate includes a contact end and a free end and wherein the contact end includes at least one wheel for contacting the support column;
   a flexible element attached between the arm and the plate to form a pivot to enable rotation of the plate; and
   a load positioned on the plate such that the pivot is located between the load and the contact end wherein the load causes rotation of the plate about the pivot to cause upward movement of the contact end to move the support column upward to decrease weight measured by the scale.

8. The cantilever device according to claim 7, wherein the plate includes a channel for receiving a guide that extends from the load.

9. The cantilever device according to claim 7, wherein the plate includes indicia for measuring a distance to the pivot.

10. The cantilever device according to claim 7, wherein the flexible element is a wire.

11. The cantilever device according to claim 7, wherein the load weighs approximately 974 grams.

12. The cantilever device according to claim 7, wherein the plate includes a cutout for providing clearance for a shaft extending from the servomotor.

13. The cantilever device according to claim 7, wherein the free end of the plate is located in the opening of the second bracket to limit vertical and horizontal movement of the free end.

14. A crystal growth apparatus, comprising:
   a pulling head having a servomotor that rotates a shaft;
   a support column that extends from the servomotor;
   a pulling rod attached to the shaft, the pulling rod having a seed holder for holding a seed crystal for initiating formation of a single crystal boule from a melt;
   a heating element for heating raw material to form the melt wherein the seed crystal extracts the boule from the melt;
   a crucible for holding the melt for forming the boule;
   a scale for measuring a weight of components of the growth station apparatus wherein upward movement of the support column decreases a weight measured by the scale;
   a horizontal arm having first and second brackets, wherein the first bracket is attached to the pulling head;
   a plate that extends through openings in the first and second brackets, wherein the plate includes a contact end and a free end and wherein the contact end includes at least one wheel for contacting the support column;
   a flexible element attached between the arm and the plate to form a pivot to enable rotation of the plate; and
   a load positioned on the plate such that the pivot is located between the load and the contact end wherein the load causes rotation of the plate about the pivot to cause upward movement of the contact end to move the support column upward to decrease weight measured by the scale.

15. The apparatus according to claim 14, wherein the plate includes a channel for receiving a guide that extends from the load.

16. The apparatus according to claim 14, wherein the plate includes indicia for measuring a distance to the pivot.

17. The apparatus according to claim 14, wherein the flexible element is a wire.

18. The apparatus according to claim 14, wherein the load weighs approximately 974 grams.

19. The apparatus according to claim 14, wherein the plate includes a cutout for providing clearance for a shaft extending from the servomotor.

20. The apparatus according to claim 14, wherein the free end of the plate is located in the opening of the second bracket to limit vertical and horizontal movement of the free end.

* * * * *